(12) United States Patent
In et al.

(10) Patent No.: US 7,714,671 B1
(45) Date of Patent: May 11, 2010

(54) WIDEBAND NONLINEAR "CHANNELIZER" FOR RAPID PROCESSING OF STATIC AND TIME-VARYING SIGNALS

(75) Inventors: Visarath In, Chula Vista, CA (US); Joseph D. Neff, San Diego, CA (US); Adi R. Bulsara, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 597 days.

(21) Appl. No.: 11/755,601

(22) Filed: May 30, 2007

Related U.S. Application Data

(63) Continuation-in-part of application No. 10/874,009, filed on Jun. 18, 2004, now Pat. No. 7,420,366.

(51) Int. Cl.
*H03B 27/00* (2006.01)

(52) U.S. Cl. ............... 331/57; 331/46; 324/326; 324/253; 324/207.16; 702/150; 702/151; 702/152; 702/153; 342/133; 342/129

(58) Field of Classification Search .......... 331/57, 331/46; 324/326, 253, 207.16; 702/150–153; 342/129, 133
See application file for complete search history.

(56) References Cited

U.S. PATENT DOCUMENTS 6,111,512 A * 8/2000 Sugimoto et al. ........... 340/577

7,420,366 B1 * 9/2008 In et al. .................. 324/253
7,463,096 B2 * 12/2008 Chi et al. ................. 331/2
7,528,606 B1 * 5/2009 In et al. .................. 324/326

OTHER PUBLICATIONS

V. In, A. Bulsara, A. Palacios, P. Longhini, A. Kno, J. Neff; Coupling-Induced Oscillations in Overdamped Bistable Systems; Physical Review E, 68, 045102(R), 2003.
A. R. Bulsara et al.; Emergent Oscillations in Unidirectionally Coupled Overdamped Bistable Systems; Physical Review E, 70, 036103, 2004.
Visarath In et al.; Complex Dynamics in Unidirectionally Coupled Overdamped Bistable Systems Subject to a Time-Periodic External Signal; Physical Review E 72, 045104(R), 2005.
Visarath In et al.; Complex Behavior in Driven Unidirectionally Coupled Overdamped Duffing Elements; Physical Review E, 73, 066121, 2006.

* cited by examiner

*Primary Examiner*—Arnold Kinkead
(74) *Attorney, Agent, or Firm*—Kyle Eppele; J. Eric Anderson

(57) ABSTRACT

A target signal analyzer having at least one receiving antenna configured to receive the target signal, and a parallel array of oscillator rings. Each oscillator ring is operatively coupled to receive the target signal from the receiving antenna. Each oscillator ring has an odd number of at least three bistable, nonlinear oscillators circularly coupled to each other such that only one-way signal flow is allowed between the oscillators in each oscillator ring. Each of the oscillator rings is configured to oscillate and thereby produce a response signal only when the target signal frequency is within a designated frequency band. For every designated frequency band in a spectrum of interest, at least one of the oscillator rings is configured to produce a response signal.

19 Claims, 5 Drawing Sheets

$n$ is an odd integer $\geq 3$ $n$ is an odd integer $\geq 3$

Parallel Array 16
of *y* Oscillator
Rings 20

WIDEBAND NONLINEAR "CHANNELIZER" FOR RAPID PROCESSING OF STATIC AND TIME-VARYING SIGNALS

CROSS-REFERENCE TO RELATED APPLICATION

This application is a continuation-in-part of U.S. application Ser. No. 10/874,009, filed 18 Jun. 2004, now U.S. Pat. No. 7,420,366 entitled "Coupled Nonlinear Sensor System" (Navy Case # 95759), hereby incorporated by reference herein in its entirety for its teachings.

FEDERALLY-SPONSORED RESEARCH AND DEVELOPMENT

The wideband nonlinear channelizer was developed with federal funds and is assigned to the United States Government. Licensing and technical inquiries may be directed to the Office of Patent Counsel, Space and Naval Warfare Systems Center, San Diego, Code 20012, San Diego, Calif., 92152; telephone (619) 553-3001, facsimile (619) 553-3821. Reference Navy Case No. 98411.

BACKGROUND OF THE INVENTION

Traditionally, detection and/or quantification of a target signal has been performed by linear, frequency-sensitive signal analyzers. These linear signal analyzers typically utilize high-speed analog-to digital converters (ADCs) to directly digitize an incoming signal. The signal is then processed using dedicated digital signal processing hardware. However, due to speed and accuracy limitations, many ADCs are required to digitize 'chunks' of the spectrum in parallel. As a result, existing target signal analyzers tend to be large and power-hungry. There is a need for a more compact, lightweight, and power efficient target signal analyzer.

BRIEF DESCRIPTION OF THE DRAWINGS

Throughout the several views, like elements are referenced using like references. Drawings are not drawn to scale.

DETAILED DESCRIPTION OF EMBODIMENTS

Figure 1:
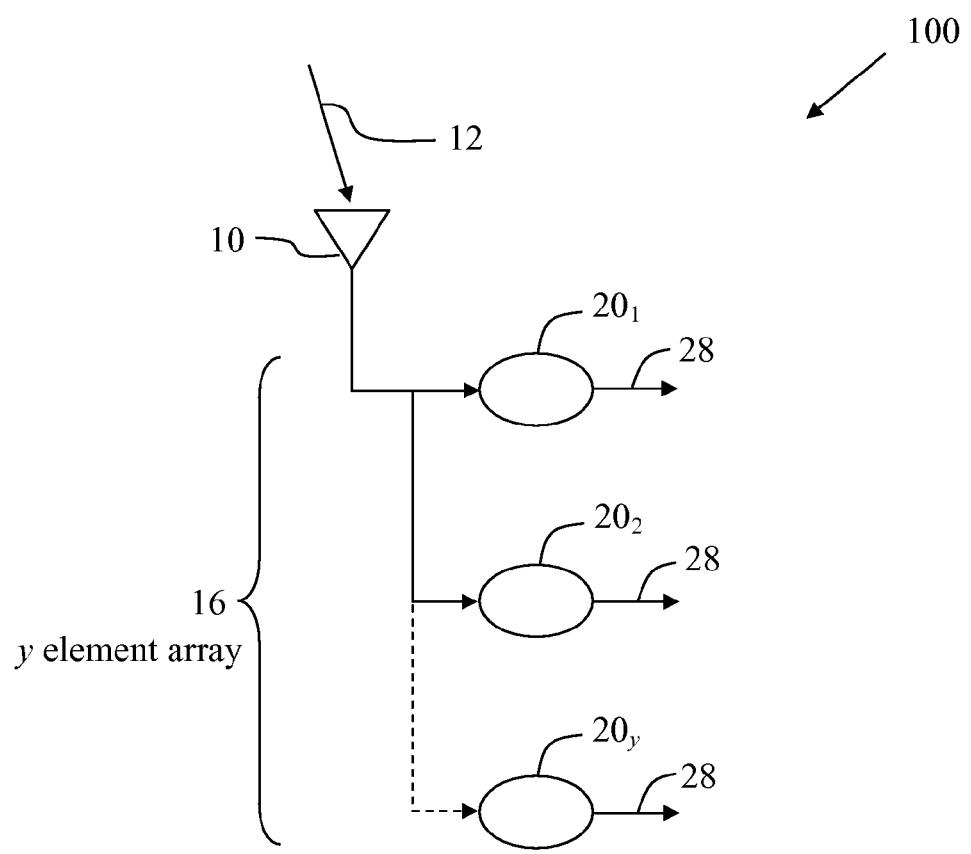
FIG. 1 shows a target signal analyzer.

FIG. 1 shows one embodiment of a target signal analyzer 100, which may be used to detect and analyze target signals 12 from very low frequencies such as, but not limited to, sonar to very high frequencies such as, but not limited to, radio frequency. The target signal analyzer 100 comprises at least one receiving antenna 10, configured to receive a target signal 12, which may be transmitted to a parallel array 16 of y oscillator rings 20. The variable y represents the number of oscillator rings 20 in the parallel array 16 and may be any positive integer. For example, the parallel array 16 may comprise thousands of oscillator rings 20 all arranged on an analog microelectronic chip. Oscillator rings $20_1$, $20_2$, and $20_y$, as shown in FIG. 1, are each examples of oscillator rings 20.

Each oscillator ring 20, such as oscillator ring $20_1$ shown in FIG. 1, is operatively coupled in parallel with respect to the other oscillator rings 20, such as oscillator rings $20_2$ and $20_y$, to receive the target signal 12. The number y of oscillator rings 20 in the parallel array 16 may be designated, as described below, to allow for the detection and processing of target signals 12 over a large bandwidth. For example, the target signal analyzer 100 may detect target signals 12 ranging from time-invariant signals to time-dependent signals such as, but not limited to, radio frequency signals. Each of the oscillator rings 20 is configured to oscillate and consequently produce a response signal 28 only when the frequency of target signal 12 is within a designated frequency band. The target signal analyzer 100 may be configured such that for every designated frequency band in a spectrum of interest, at least one of the oscillator rings 20 produces a response signal 28. In other words, when the parallel array 16 is exposed to any given target signal 12 at least one of the oscillator rings 20 will oscillate and produce a response signal 28 that may be used to analyze the target signal 12. In essence, the target signal 12 is "channeled" through the appropriate oscillator ring 20, or rings 20, of the parallel array 16. Thus, the target signal analyzer 100 may be referred to as a wideband "channelizer." The relatively low weight, low power consumption, and small size of the target signal analyzer 100, as well as the ability to construct thousands of oscillator rings 20 on a single analog microchip make it possible for the target signal analyzer 100 to be man-portable.

Figure 2:
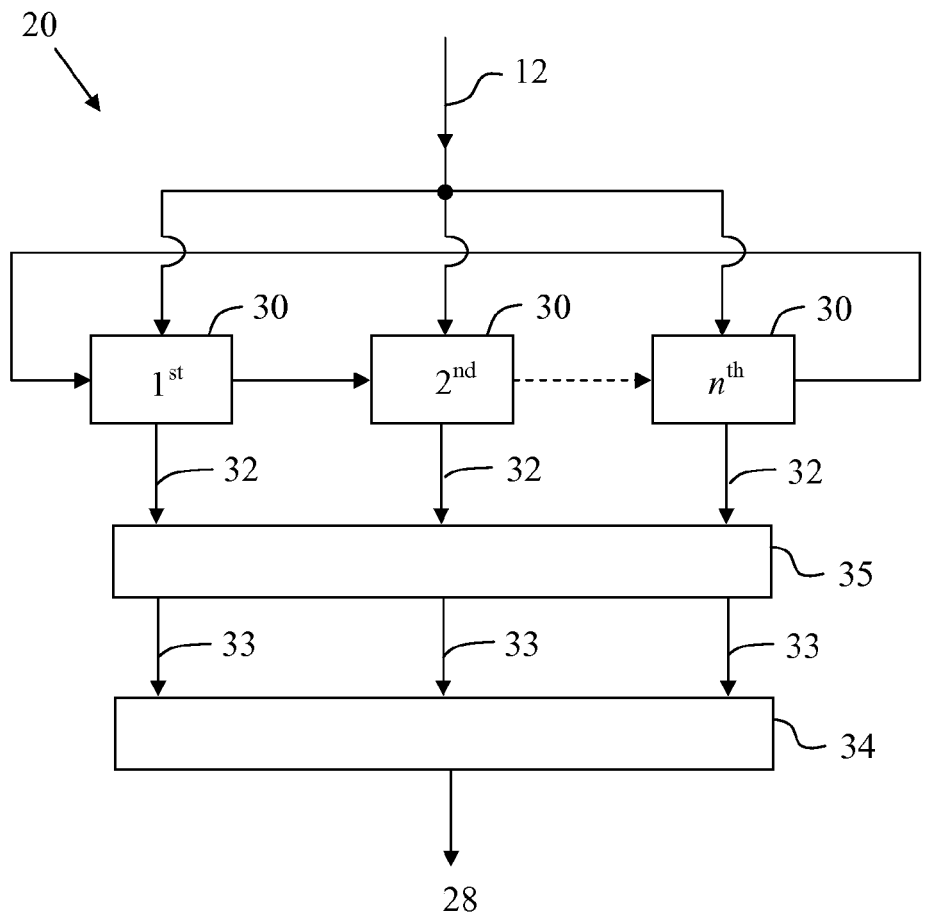
FIG. 2 shows an oscillation ring from a target signal analyzer.

As shown in FIG. 2, each oscillator ring 20 comprises a total of n overdamped, bistable, nonlinear oscillators 30 circularly coupled to each other such that only one-way signal flow is allowed between the oscillators 30 in each oscillator ring 20. The variable n represents the number of oscillators 30 in each oscillator ring 20 and may be any positive, odd number greater than or equal to three. The dynamics of each oscillator ring 20 may be described, but not limited, according to the time derivative of a state variable x of the oscillator 30 as follows:

$$dx_i/dt = -kx_i + w_{ii} \tan h(cx_i) + w_{ij} \tan h(cx) + \epsilon(t), \qquad (1)$$

where i is an index and $1 \leq i \leq n, j=i+1$, and $x_{n+1} = x_1$. The state variable x represents the state of the oscillator 30 and is typically measured in voltage or current depending on the operational mode of the circuit design. The function $\epsilon(t)$ represents the target signal 12, which can be written as A sin($\omega$t), where A is the amplitude and $\omega$ is the angular frequency (frequency) of the target signal 12. The dynamical parameters c and k are inherent parameters of the oscillator 30. The constant w, which sets the maximum amplitude or saturation states of the oscillator 30, is known as the coupling coefficient.

The response of an oscillator ring 20 to a direct current (dc) target signal 12 may be determined by calculating a critical coupling parameter $\eta_{ijc}$ according to the following expression:

$$\eta_{ijc} = y_{ic} - \eta_{ii} \tan h \, y_{ic} - \epsilon(t)c/k, \qquad (2)$$

where $\eta_{ii} \equiv w_{ij}c/k$, $y_{ic} = \text{sech}^{-1}(1/\sqrt{\eta_{ii}})$, and $n_{ijc}$ is a critical threshold value of coupling strength. When $\eta_{ij} < \eta_{ijc}$ the oscillator 30 oscillates non-sinusoidally with a frequency that increases as the coupling strength decreases away from $\eta_{ijc}$. In other words, the oscillation frequency of oscillator 30 increases as $\eta_{ij}$ becomes "more negative" compared to $\eta_{ijc}$. On the other hand, when $\eta_{ij} > \eta_{ijc}$, the oscillator 30 quickly decays into one of its available steady states with no oscillations. The individual oscillations of each oscillator 30 in an oscillator ring 20 are shown in FIG. 2 as oscillations 32. When the coupling parameter $\eta_{ij}$ is slightly to the right of the critical coupling parameter ($|\eta_{ij}|<|\eta_{ijc}|$) the oscillator ring 20 is non-oscillating. In contrast, when the coupling parameter $\eta_{ij}$ is swept through its critical value and given a value such that ($|\eta_{ij}|>|\eta_{ijc}|$), all the oscillators 30 in the given oscillator ring 20 oscillate. The oscillations 32 may be quantified through a power spectral density analysis of the response signal 28. The individual oscillation period $T_i$ may be obtained according to the following expression:

$T_i = n(t_i + t_j)$, where $t_i = 2/D_i(\pi/2 - \tan^{-1}(B_i/D_i))$, $t_j = 2/D_j(\pi/2 - \tan^{-1}(B_j/D_j))$, $B_i = -2y_{ic} \tan h \, y_{ic} = B_j$, $D_i^2 = 4 \tan h \, y_{ic}(y_{ic} - \eta_{ii} \tan h \, y_{ic} - \eta_{ij} - \epsilon(t)c/k)$, and $D_j^2 = 4 \tan h \, y_{ic}(y_{ic} - \tan h \, y_i - \eta_{ij} + \epsilon(t)c/k)$. (3)

The response signal 28 is the summed output $$\sum_i x_i(t)$$

of the oscillator ring 20, which oscillates at a period $T_\Sigma = T_i/n$, which is independent of n. The individual oscillator 30 oscillations 32 are separated in phase by $2\pi/n$. The change in oscillation frequency and the asymmetry induced by the target signal 12 in the response signal 28 may be used to quantify the dc target signal 12. As shown in FIG. 2, the oscillations 32 may be converted into a digital signal 33 by an analog to digital converter 35. The digital signal 33 of each oscillator 30 in an oscillator ring 20 may be summed with a summer 34 to produce the response signal 28.

Figure 3:
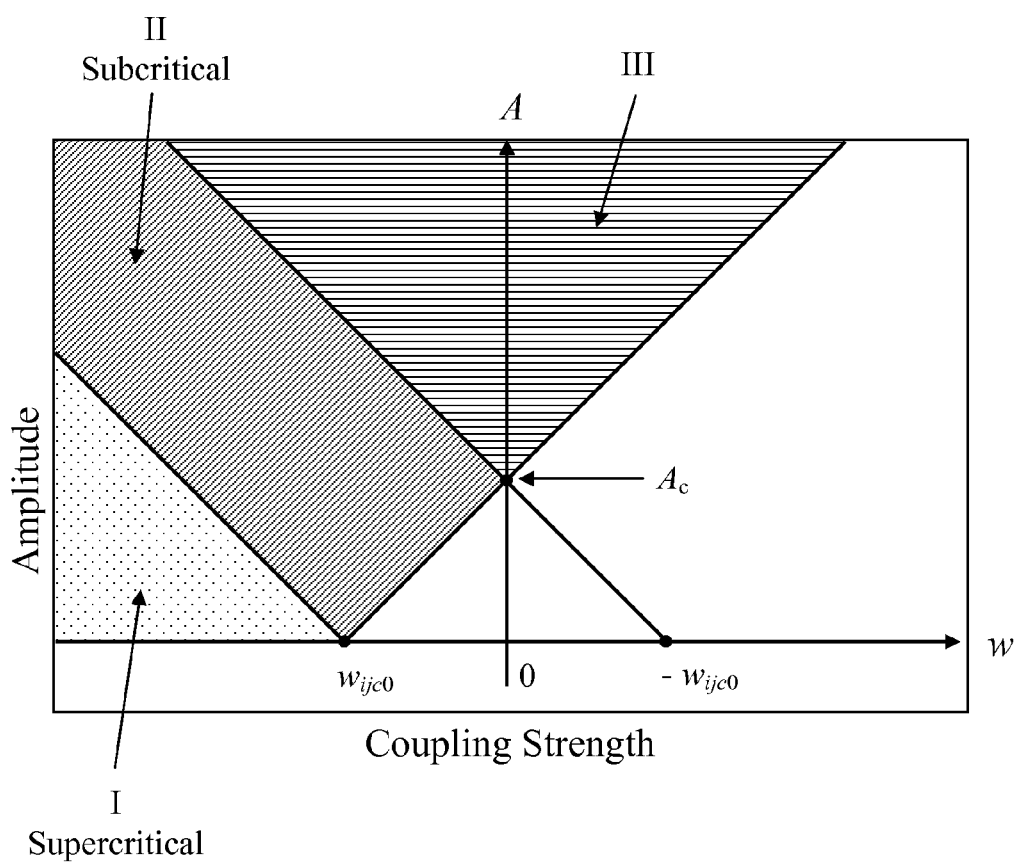
FIG. 3 shows a bifurcation diagram of an oscillator ring response to a time-varying signal.

FIG. 3 is a bifurcation diagram representing the response of an oscillator ring 20 to a time-varying target signal 12 such as A sin($\omega t$), as described above, with increasing amplitude A versus the strength of the coupling coefficient w. A critical coupling coefficient $w_{ijc0}$ is also shown, which represents the critical value of the coupling coefficients to generate oscillations in the absence of any target signal 12. Oscillatory behavior in an oscillation ring 20 does not occur in a single unforced, or undriven oscillator 30. The confluence of the number of oscillators 30, the initial conditions, and the type of coupling allow for the emergence of the oscillatory behavior. As shown in FIG. 3, there are three significant regions of response: region I, region II, and region III. In the supercritical region I, where $w_{ij} < w_{ijc0}$, the oscillator ring 20 is not frequency-locked to the incoming target signal 12, rather the oscillator ring 20 oscillates at its natural frequency. Harmonics and sub-harmonics of the target signal 12 frequency w may also be found region I. In the sub-critical region II, where $w_{ij} > w_{ijc0}$, the oscillator ring 20 is frequency-locked to the target signal 12 so that each oscillator 30 of the oscillator ring 20 switches at a frequency that is $\omega/n$, and the summed signal of oscillators 30 in the ring 20 is generally equal to the frequency of the time-varying target signal 12. In both regions I and II, the oscillators 30 of the oscillator ring 20 switch in the out-of-phase pattern. In region III, the dynamics of each oscillator 30 is over-driven by the incoming target signal 12, resulting in an in-phase response with respect to each other and the target signal 12. In region III, the frequency of the oscillator ring 20 generally equals the frequency $\omega$ of, and is in nearly perfect synchronization with the target signal 12. In both regions II and III, the response of the oscillator ring 20 is overwhelmingly driven by the phase and frequency qualities of the target signal 12. In this sense, the oscillator ring 20 is 'channeling' the significant qualities of the target signal 12. Even in region II, where frequency down-conversion to frequency $\omega/n$ occurs, the phase information of the target signal 12 is preserved via the synchronization effect.

Figure 4:
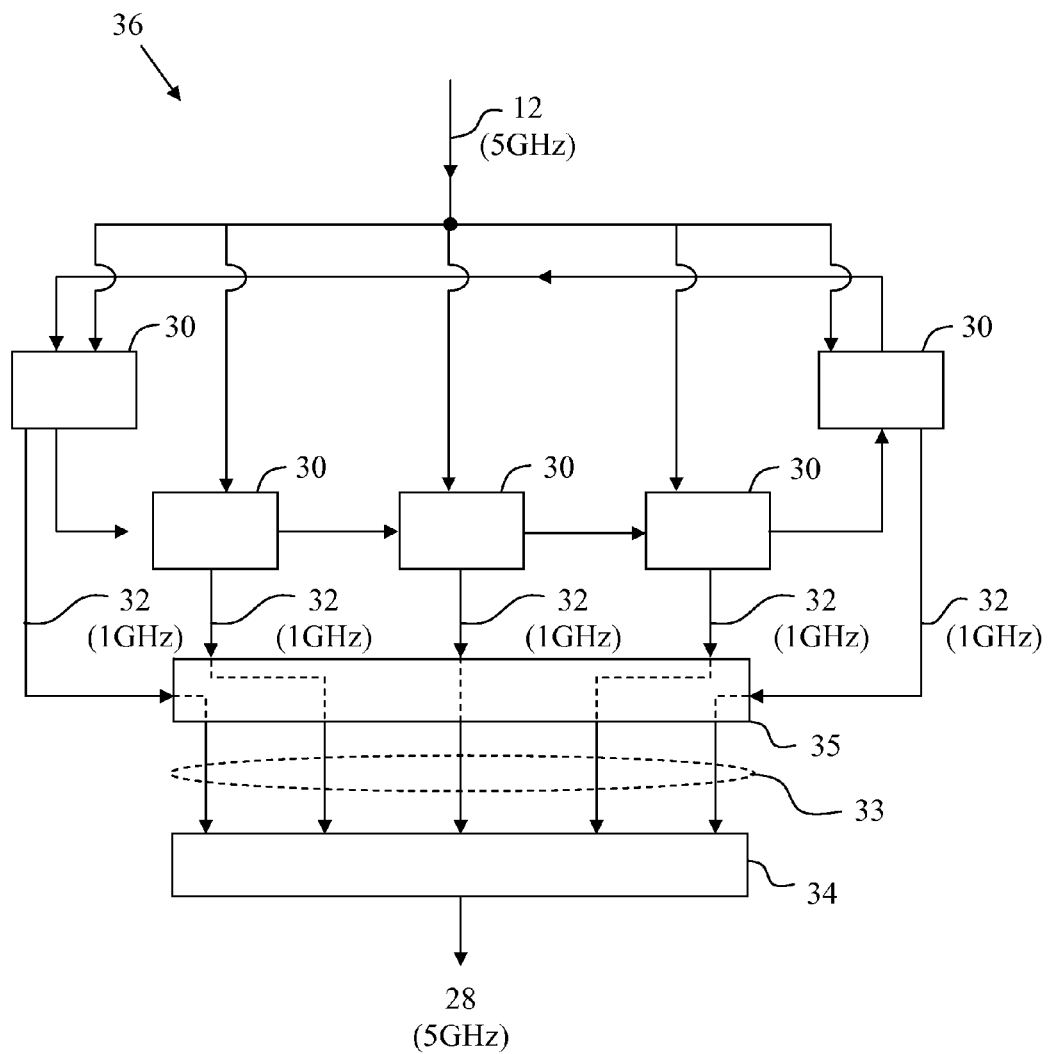
FIG. 4 shows a five-element embodiment of an oscillator ring.

FIG. 4 shows one embodiment of an oscillator ring 20 comprising five oscillators 30 and a summer 34, shown as oscillator ring 36. FIG. 4 illustrates the following example: If the maximum switching frequency for each oscillator 30 is 1 GHz, then five of the oscillators 30 may be constructed in an oscillator ring 20 that responds collectively to a 5 GHz target signal 12. Thus, several low-switching-frequency oscillators 30 may be circularly coupled in an array to detect higher frequencies. As shown in FIG. 4, each oscillator 30 of oscillator ring 36 switches/oscillates at 1 GHz with a relative phase difference with regard to the other oscillators 30 that is $2\pi/5$ radians. Each oscillator 30 contains a representation of the 5 GHz target signal's 12 phase information with a bandwidth limitation on the order of several GHz. When the target signal frequency $\omega$ is very high (i.e. in the GHz regime) one may employ a large number n of oscillators 30 in the oscillator ring 20 so that the resulting response signal 28 is dynamically down-converted to frequency $\omega/n$ through a careful selection of operating parameters which confine the oscillators 30 to the appropriate region in the phase space, as shown in FIG. 3.

Figure 5:
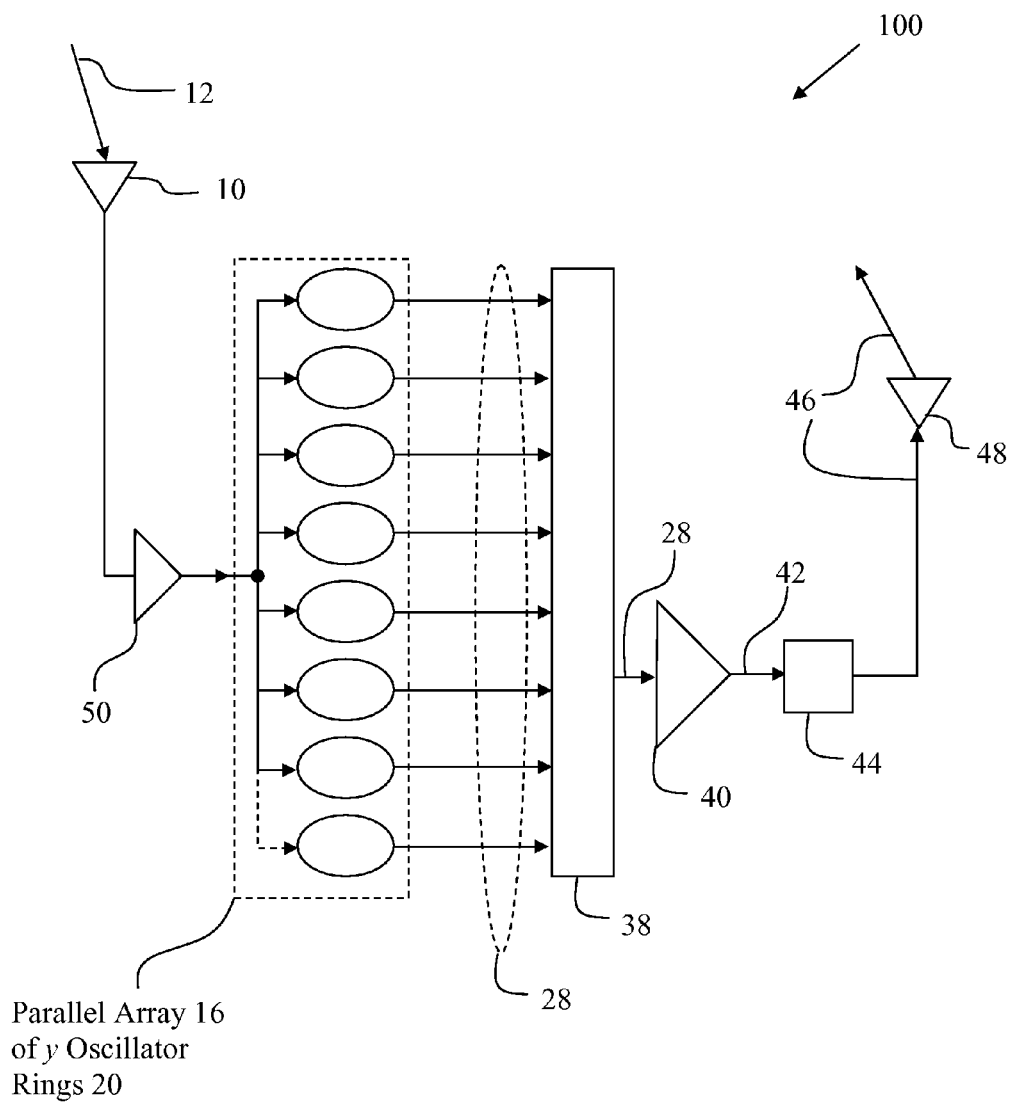
FIG. 5 shows an embodiment of the target signal analyzer with a radiating antenna.

FIG. 5 shows an embodiment of the target signal analyzer 100 further comprising a processor 38, operatively coupled to receive the response signals 28 from each of the oscillation rings 20 in the parallel array 16. The processor 38 may process, analyze, and/or store the response signals 28. Also shown in FIG. 5, the processor 38 may transmit the response signals 28 to an amplifier 40. The amplifier 40 outputs an amplified response signal 42, which is transmitted to a signal-conditioning unit 44 where the amplified response signal 42 is transformed into a conditioned signal 46. The conditioned signal 46 may then be radiated by an emitting antenna 48. The frequency of the conditioned signal 46 is the same as the oscillation frequency of those oscillation rings 20, which oscillated in response to the target signal 12. A pre-amplifier 50 is also shown as operatively coupled to receive, amplify, and transmit the target signal 12 to the parallel array 16 of oscillator rings 20.

The oscillator rings 20 in the parallel array 16 may be configured to operate in two different regimes. When configured for the sub-critical regime, region II, the coupling coefficients w of the oscillators 30 are tuned slightly to the right (less negative) of the critical coupling value $w_{ijc0}$ so that the oscillators 30 are poised on the threshold of oscillation. When a target signal 12 is present with sufficient amplitude and within the configured frequency, the oscillators 30 begin to oscillate either at the same, or at 1/n times the frequency of the target signal 12. From this information, the processor 38 may detect the target signal 12 and quantify its frequency $\omega$. When configured for the supercritical regime, region I, the coupling coefficients w are tuned beyond the critical coupling value $w_{ijc0}$ so that the oscillators 30 are oscillating prior to the arrival of any target signal 12. Upon arrival, the target signal 12 affects both the amplitude and frequency of the oscillations 32 of the oscillators 30. By analyzing the response signals 28 from the oscillator rings 20, the processor 38 may determine the frequency $\omega$ and the amplitude A of the target signal 12. A standard PSD algorithm may be utilized by the processor 38 to analyze the response signal 28. In either regime, information contained in the oscillation frequency of the response signal 28 may also be used to classify the source of the target signal 12.

From the above description of the wideband, nonlinear channelizer, it is manifest that various techniques may be used for implementing the concepts of the Target Signal Analyzer 100 without departing from its scope. The described embodiments are to be considered in all respects as illustrative and not restrictive. It should also be understood that the Target Signal Analyzer 100 is not limited to the particular embodiments described herein, but is capable of many embodiments without departing from the scope of the claims.

We claim:

1. A target signal analyzer comprising:
   at least one receiving antenna configured to receive the target signal;
   a parallel array of oscillator rings, wherein each oscillator ring is operatively coupled to receive the target signal from the receiving antenna, each oscillator ring comprising:
      an odd number of at least three bistable, nonlinear oscillators circularly coupled to each other such that only one-way signal flow is allowed between the oscillators in each oscillator ring;
   wherein each of the oscillator rings is configured to oscillate and thereby produce a response signal only when the target signal frequency is within a designated frequency band; and
   wherein, for every designated frequency band in a spectrum of interest, at least one of the oscillator rings is configured to produce a response signal.

2. The apparatus of claim 1, wherein each oscillator ring further comprises a summer configured to sum the oscillation frequencies from each oscillator in the respective oscillator ring.

3. The apparatus of claim 2, wherein the parallel array of oscillator rings comprises thousands of oscillator rings disposed on an analog microelectronic chip.

4. The apparatus of claim 1, wherein each oscillator ring further comprises an A/D converter operatively coupled to convert each oscillation from the oscillation ring into a digital signal.

5. The apparatus of claim 4, wherein each oscillator ring further comprises a summer configured to sum the digital signals from each oscillator in the respective oscillator ring to produce the response signal.

6. The apparatus of claim 5, wherein the parallel array of oscillator rings comprises thousands of oscillator rings disposed on an analog microelectronic chip.

7. The apparatus of claim 5, further comprising a processor operatively coupled to receive and analyze the response signal from the array of oscillator rings.

8. The apparatus of claim 6, further comprising a processor operatively coupled to receive and analyze the response signal from the array of oscillator rings.

9. The apparatus of claim 5, further comprising a preamplifier operatively coupled to amplify the target signal and then transmit the amplified target signal to the parallel array of oscillator rings.

10. The apparatus of claim 9, further comprising an amplifier operatively coupled to receive and amplify the response signal from the processor.

11. The apparatus of claim 10, further comprising a signal conditioner operatively coupled to receive the amplified response signal from the amplifier.

12. The apparatus of claim 11, further comprising a radiating antenna operatively coupled to receive and radiate the conditioned response signal from the signal conditioner, wherein the frequency of the conditioned response signal is substantially identical to the target signal.

13. The apparatus of claim 12, wherein the apparatus is man-portable.

14. The apparatus of claim 2, wherein the oscillation frequency of each oscillator in its respective oscillator ring is dynamically down-converted to frequency $\omega/n$, where $\omega$ is the frequency of the target signal and n is the number of oscillators in the oscillator ring.

15. The apparatus of claim 5, wherein the oscillation frequency of each oscillator in its respective oscillator ring is dynamically down-converted to frequency $\omega/n$, where $\omega$ is the frequency of the target signal and n is the number of oscillators in the oscillator ring.

16. A method for analyzing a target signal comprising the steps of:
   receiving the target signal;
   exposing a parallel array of oscillator rings to the target signal, wherein each oscillator ring comprises an odd number of at least three bistable, nonlinear, overdamped oscillators and each oscillator ring is disposed to produce a response signal only when the target signal frequency is within a discrete frequency band in a frequency spectrum of interest;
   unidirectionally coupling the oscillators in each oscillator ring;
   conveying the response signal to a processor;
   comparing the phase and frequency of the response signal with the phase and frequency of the target signal with the processor.

17. The method of claim 16, further comprising summing the oscillation frequencies from each oscillator in each oscillator ring to produce the response signal.

18. The method of claim 17, further comprising:
   amplifying the response signal; and
   radiating the response signal.

19. A method for analyzing a target signal comprising the steps of:
   unidirectionally coupling an odd number of at least three bistable, nonlinear oscillators into an oscillation ring;
   oscillating the oscillators at their natural frequency;
   receiving the target signal;
   exposing the oscillator ring to the target signal;
   receiving an oscillation response from the oscillator ring;
   analyzing the effect of the target signal on the frequency and amplitude of the oscillation response;
   determining the frequency and field strength of the target signal from the effect of the target signal on the oscillation response.

* * * * *